United States Patent [19]

Hupe et al.

[11] Patent Number: 5,373,629

[45] Date of Patent: * Dec. 20, 1994

[54] THROUGH-HOLE PLATE PRINTED CIRCUIT BOARD WITH RESIST AND PROCESS FOR MANUFACTURING SAME

[75] Inventors: Jürgen Hupe, Langenfeld; Walter Kronenberg, Cologne, both of Germany

[73] Assignee: Blasberg-Oberflachentechnik GmbH, Solingen, Germany

[*] Notice: The portion of the term of this patent subsequent to Mar. 16, 2010 has been disclaimed.

[21] Appl. No.: 836,261

[22] PCT Filed: Aug. 11, 1990

[86] PCT No.: PCT/EP90/01326

§ 371 Date: Feb. 28, 1992

§ 102(e) Date: Feb. 28, 1992

[87] PCT Pub. No.: WO91/03920

PCT Pub. Date: Mar. 21, 1991

[30] Foreign Application Priority Data

Aug. 31, 1989 [DE] Germany ............... 3928832

[51] Int. Cl.$^5$ ............... H01K 3/10; B32B 3/10
[52] U.S. Cl. ............... 29/852; 428/137; 428/195; 428/209; 428/409; 29/840; 427/97
[58] Field of Search ............... 29/852, 840; 427/97, 427/96; 205/126; 428/137, 195, 209, 409, 457; 156/625, 657

[56] References Cited

U.S. PATENT DOCUMENTS

| | | | |
|---|---|---|---|
| 4,444,619 | 4/1984 | O'Hara | 29/852 X |
| 4,581,301 | 4/1986 | Michaelson | 29/840 X |
| 4,585,502 | 4/1986 | Vozu et al. | 29/840 X |
| 4,604,427 | 8/1986 | Roberts et al. | |
| 4,704,791 | 11/1987 | Chellis et al. | 29/852 |
| 4,790,912 | 12/1988 | Holtzman | 427/97 |
| 4,931,148 | 6/1990 | Kukanskis et al. | 205/126 |
| 5,145,572 | 9/1992 | Hupe et al. | 29/852 X |
| 5,160,579 | 11/1992 | Larson | 29/852 X |
| 5,194,313 | 3/1993 | Hupe et al. | |

FOREIGN PATENT DOCUMENTS

| | | |
|---|---|---|
| 0206133 | 12/1986 | European Pat. Off. . |
| 0248683 | 12/1987 | European Pat. Off. . |
| 2123036 | 1/1984 | United Kingdom . |
| 89/05568 | 6/1989 | WIPO . |
| 89/08375 | 9/1989 | WIPO . |

OTHER PUBLICATIONS

E. M. Engler, "Simple metallization procedure for insulating materials", IBM Technical Disclosure Bulletin, vol. 22, No. 1, Jun. 1979, p. 393.

Herbert Naarmann, "Elektrisch leitfähige Polymere: Anwendungs–Spektrum noch nicht ausgereizt", Chemische Industrie, vol. 8, No. 6, 1987, pp. 59–64.

*Primary Examiner*—Carl J. Arbes
*Attorney, Agent, or Firm*—Wegner, Cantor, Mueller & Player

[57] ABSTRACT

A process is described for manufacturing through-hole plated single-layer or multi-layer printed circuit boards based on a polymeric substrate material or on a ceramic material provided optionally on both sides with at least one photoresist layer temporarily exposing the electroconductive circuit pattern by electroplating or electroless plating with a metal layer also on those surfaces which have not been coated with a conductive metal layer, characterized in that a) the surfaces of the substrate, after hole-drilling and a subsequent mechanical surface-treatment, are laminated with a suitable photoresist, exposed to light and developed so that the circuit pattern image is exposed, b) the surfaces of the substrate are pre-treated in a solution having oxidizing activity, c) after removal of the residual solution by rinsing, the substrate is introduced into a solution which contains at least one heterocyclic monomer, and more specifically pyrrole, thiophene, furane or derivative(s) thereof, which in a polymeric form is electrically conductive, d) the substrate is then transferred into an acidic solution whereby an electrically conductive polymeric layer is formed, whereupon, if desired or required, any residual solution is removed by rinsing, and the through-holes and the circuit pattern image are metallized in one step by galvanic or, preferably, electroless metallization.

22 Claims, No Drawings

THROUGH-HOLE PLATE PRINTED CIRCUIT BOARD WITH RESIST AND PROCESS FOR MANUFACTURING SAME

The present invention relates to a process for manufacturing through-hole plated single-layer or multi-layer printed circuit boards based on a polymeric substrate material or on ceramics provided optionally on both sides with at least one photoresist layer temporarily exposing the electroconductive circuit pattern by galvanic or electroplating or electroless plating with a metal layer also on those surfaces which have not been coated with a conductive metal layer; the invention further relates to the printed circuit boards themselves.

Through-hole plated printed circuit boards so far have been essentially produced by chemical metal deposition on catalytically activated surfaces of a substrate material. Multi-layer printed circuit boards are also prepared in this manner. The metal layers having been deposited without external current (electroless) are then further reinforced, if desired, by metal-electroplating (galvanic metal deposition). This technology enables high-quality printed circuit boards to be manufactured. The catalytic activation of the surface is generally effected by means of ionic or non-ionic noble metal-containing catalysts which, more specifically are based on palladium and tin. However, systems containing no noble metals, for example based on copper, may also be used. In some cases, there has also been known the use of catalytically active layers which have been applied by a physical method, for example by vapor deposition.

The methods have been described in the pretinent literature, for example in Hermann, Handbuch der Leiterplattentechnik, Eugen G. Leuze Verlag, Saulgau. The wet-chemical catalysis employed in practice with the use of systems containing noble metals or containing no noble metals generally proceeds by the following route:

1. Cleaning/conditioning
2. Rinsing
3. Activating/initial etching
4. Rinsing
5. Pre-immersion solution
6. Application of the catalyst
7. Rinsing
8. Addition of an accelerator/reductor
9. Anew rinsing
10. Electroless metallization
11. Rinsing
12. Drying.

The quality of nucleation (catalysis) and, hence the quality of the final product, is very much dependent on the methods of pre-treatment which precede catalysis. This is particularly applicable to the conditioning step wherein, on the one hand, the surfaces are cleaned while, on the other hand, the bore hole walls are prepared for the subsequent catalysis. The preparation is effected by means of particular surfactants which occupy the entire surface and have the marked property of adsorbing the catalyst nuclei. The actual catalyst application is followed by a treatment which is appropriate to the system and either removes interfering by-products from the catalyst treatment or converts the nuclei applied in the catalyst into their catalytically active form. Then the step of electroless metallization is carried out. In general, copper is deposited. Minor deviations from the pre-scribed process parameters in one of the process steps will usually lead to a defective metallization so that in many cases the final product is unusable.

Accordingly, one essential drawback inherent to these catalyst systems is the dependence of the nucleation density on the pre-treatment, the particle size and the after-treatment step. The higher the nucleation density, the better is the initial deposition rate or the density of the beginning electroless copper-plating, which is equivalent to a high quality through-hole plating. However, defective spots called "voids" in technical jargon, will tend very easily to occur, which voids will greatly reduce the quality of through-hole plating or even render the printed circuit boards unusable. But even under the optimum conditions a surface having been completely occupied with nuclei cannot be obtained. Moreover, the existing catalyst systems are susceptible to inadvertently imported alien ions. Thereby, the reproducibility of their mode of operation as well as the stability thereof are strongly deteriorated. Another disadvantage of the noble metal-containing catalyst systems is the high price of the metals used.

The technology of prior art employing an electroless metallization, followed by optional reinforcing by way of galvanic metal deposition, although it is being widely used, has some disadvantages which so far had to be put with due to the lack of feasible alternatives. Above all, the purely chemical metal deposition from reductively-working electrolytes is very expensive and requires an accurate technique of analysis and precise control of the electrolyte. Said electrolytes also contain the by far most expensive chemicals. Nevertheless, layers having been thus deposited are of a physically and mechanically poorer quality than metal layers obtained by electroplating. Another disadvantage of the technology employed so far resides in the uncertainty in the stabilization of the systems and, hence, also the uncertainty of whether the deposition rate and layer thickness in the bore hole walls are sufficiently reproducible. The electrolytes, due to their low stability, tend to undergo auto-decomposition. Moreover, said electrolytes, as a rule, contain formaldehyde as reducing agent which under aspects of industrial safety is to be avoided. Moreover, the reductively working electrolytes contain larger amounts of complex-forming agents which are poorly biodegradable and, therefore, constitute a considerable pollution of the waste water.

It has been attempted for long to evade a chemical metallization and instead to employ a direct galvanic metal deposition. Such a process has been described, for example, in the U.S. Patent Specification No. 3,099,608 and in the German Published Unexamined Patent Application (DE-OS) 33 04 004. However, the processes described therein have not been put into any practical use. Fairly utilizable results can be attained only with freshly prepared galvanically working electrolytes. Already shortly after the begin of the operation the quality of the obtained metal deposit decreases to such an extent that from then only unusable results will be attained. Moreover, rather long periods of time are required for the metal deposition. Upon use of the process described in U.S. Pat. No. 3,099,608 at least 20 minutes are required for the metal deposition. Furthermore, defective spots (voids) will very rapidly occur to an increasing degree in the metallization. Thereby, metal layers are formed on the hole walls which do insufficiently adhere.

In Applicant's German Published Unexamined Patent Application (DE-OS) 38 06 884 which has not been previously published there has been proposed a process for manufacturing through-hole plated printed circuit boards, said process allowing a safe, strongly adhering and continuous activation to be effected of the employed substrate material, reducing the number of process steps, thereby fast and inexpensively leading to products which are excellent in quality. The process further ensures high certainty with respect to a reproducible mode of operation. The subsequent metallization is feasible not only by the electroless route as conventional, but also via a direct galvanic process. This process may be characterized by following general procedures:

1. Oxidative pre-treatment;
2. Rinsing;
3. Catalysis;
4. Activation;
5. Rinsing;
6. Preferably galvanic or electroless metallization.

According to said process, the circuit board provided with drilled through-holes is plated-through by an electroless or, preferably, galvanic, metal deposition. The through-hole plated printed circuit boards then can be overlaid with a screen or photo print such as to produce a circuit pattern image upon exposure and development. Then, the circuit pattern is established in Pattern Plating by the galvanic deposition of metallic layers.

However, this process has the drawback of that, in the first step of electroplating for through-hole plating the bore walls, the photographic process must be first carried out for establishing the circuit pattern image, which only then is followed by a further electroplating step in which the circuit pattern image is galvanically or electroless copper-plated.

Therefore, it is the object of the invention to provide a simplified process for manufacturing through-hole plated single-layer or multi-layer printed circuit boards in Pattern Plating, which process allows the two electroplating steps to be combined to one step of electroplating, whereby the process is faciliated and rendered less expensive.

The object of the invention has been attained by a process which is characterized in that a) the surfaces of the substrate, after hole-drilling and a subsequent mechanical surface-treatment, are laminated with a suitable photoresist, exposed to light and developed so that the circuit pattern image is exposed, b) the surfaces of the substrate are pre-treated in a solution having oxidizing activity, c) after removal of the residual solution by rinsing, the substrate is introduced into a solution which contains at least one heterocyclic monomer, and more specifically pyrrole, thiophene, furane or derivative(s) thereof, which in a polymeric form is electrically conductive, d) the substrate is then transferred into an acidic solution whereby an electrically conductive polymeric layer is formed, whereupon, if desired or required, any residual solution is removed by rinsing, and the through-holes and the circuit pattern image are metallized in one step by galvanic or, preferably, electroless metallization.

In a further embodiment, the sequence of steps a) and b) is reversed, with step a) being preceded by a step of rinsing and drying and a mechanical surface cleaning operation.

Furthermore, it is particularly advantageous that the step b) is preceded by process steps wherein the bored printed circuit board is subjected to a process of initial etching and a surface pre-treatment of the circuit boards. Initial etching is effected by an acidic solution having oxidative activity. The treatment of the bore hole walls which are not conductive is effected by using organic, preferably nitrogen-containing solvents or aqueous alkaline solutions thereof, which may optionally contain wetting agents.

The solution employed for the process step b) contains salts of permanganate, manganate, periodate and/or of a cerium(IV) compound. The oxidative pre-treatment as described in greater detail hereinbelow may be carried out in a pH range of from <1 to 14 and at a temperature of from 20° C. to 95° C. The addition of ionic or non-ionic surfactants in an amount of from 0.1 to 10 g/l improves the quality of the oxidative pre-treatment, is, however, not essential. The oxidative agents are present in a concentration ranging from 0.1 g/l to their solubility limits. The duration of pre-treatment may be between 0.2 and 20 minutes.

The solution employed for step c) preferably contains from 1 to 50% of pyrrole and further the complementary amount of solvents or solubility promoters and optionally also alkalizing additives. Of course, mixtures of solvents or solubility promoters may also be used. Usable as solvents or solubility promoters, respectively, are, e.g., water, methanol, ethanol, n-propanol, isopropanol, higher alcohols, polyalcohols, DMF (dimethyl formamide), ketones, more particularly methylethylketone, cumene sulfonate, N-methyl pyrrolidone, Triglyme, Diglyme, alkali metal salts of toluene sulfonates or their ethyl esters and aqueous alkaline solutions or mixtures thereof.

Subsequently to process step c), the articles to be metallized, such as printed circuit boards, are subjected to activation in the process step d). The activation may be carried out with oxidative substances such as, for example, alkali metal persulfates, alkali metal peroxodisulfates, hydrogen peroxide, iron(III) salts such as ferric chloride, ferric sulfate, potassium hexacyanoferrate(III), alkali metal periodates or similar compounds in an acidic medium. There is also the possibility to allow the activation to take place just in an acidic medium, for which hydrochloric acid, sulfuric acid, phosphoric acid etc. may be used as acids. The activation may be effected in an acidic oxidizing medium as well as in an acidic medium with optional permanent air purging.

Further galvanic processing following the process steps a), b) and c) of the articles to be metallized such as, e.g., printed circuit boards, is further illustrated in the following sections.

In a preferred embodiment of the process according to the invention, metals such as copper, nickel, gold, palladium, tin, lead, tin/lead are used for the preparation of the metal layer.

By means of the process according to the invention, there is obtained a through-hole plated single-layer or multi-layer printed circuit board based on a polymeric substrate material or on ceramics provided optionally on both sides with at least one photoresist layer temporarily exposing the electroconductive circuit pattern. This through-hole plated printed circuit board is characterized in that between the metal layer on the inner surface of the through-plated bore holes and the substrate material or the ceramics there is present a layer of polymerized electroconductive synthetic material. The layer composed of the electroconductive synthetic material, more specifically, consists of polymerized or copolymerized pyrrole. The layer of the synthetic polymer is preferred to have a thickness of from 0.1 to 10 μm.

As an intermediate product, there is formed a perforated single-layer or multi-layer board based on a polymeric substrate material or on ceramics provided optionally on both sides with at least one photoresist layer exposing the electroconductive printed circuit image, while on the area contiguous to the bore hole a layer of a polymerized electroconductive synthetic material is located which preferably consists of polymerized pyrrole or pyrrole derivatives.

The substrate materials to be used include, more particularly, a glass fiber-reinforced epoxide resin, a polyimide and other solid polymers. Basically, any material is suitable which are capable of being coated with a metal layer when treated by the process steps according to the invention. The through-hole plated printed circuit boards are preparable by the process according to the invention basically on three different routes.

First, the metal may be deposited by aid of polymerized electroconductive heterocyclic compounds such as pyrrole, thiophene and furan with concomitant use of electroless reductive electrolytes.

A printed circuit board made of a substrate material such as glass fiber-reinforced epoxide resin which has been pre-treated by the pre-treatment method according to the invention—which method will be described hereinbelow—is placed in a reductive electrolyte so that a metal, preferably copper, is chemically deposited.

A different method of metal deposition employs polymeric electroconductive compounds, and more particularly pyrrole, thiophene and furan in the absence of electroless-working reductive electrolytes. Copper is preferred to be deposited by this method. A printed circuit board made of a substrate material such as glass fiber-reinforced epoxide resin which has been pre-treated by the pre-treatment method according to the invention—which method will be described hereinbelow—is placed in a galvanic copper electrolyte so that a copper deposition is effected on the pre-treated copper backing of the printed circuit board as well as on the pre-treated bore hole walls.

The present invention combines the two electroplating steps of prior art in that the substrate materials, having been provided already with a developed photoresist, are first subjected to catalysis and activation and then subjected to copper-plating, preferably by the galvanic method, but otherwise by the electroless method, of the bore hole walls and of the circuit pattern image exposed by the photoresist.

Hereinbelow, the process steps of the process according to the invention will be explained in greater detail.

The process according to the invention may be characterized by the following general working steps:
a) Laminating circuit boards with photoresist, exposure, developing
b) Oxidative pre-treatment
c) Rinsing
d) Catalysis
e) Activating
f) Rinsing
g) Pickling
h) Galvanic or chemical copper plating.

In a preferred embodiment of the process according to the invention, prior to the step b) comprising the oxidative pre-treatment there may be carried out a procedure for initially etching, a rinsing operation, a cleaning step and a cleaning and surface treatment of the bore holes, followed by a further rinsing step.

In a further embodiment, the sequence of steps a) and b) may be reversed, with step a) being preceded by a step of rinsing and drying and a mechanical surface cleaning operation.

The copper-laminated bored-through circuit boards are first laminated with a suitable photoresist, exposed to light and developed so that, after the process step a), the circuit pattern image has been exposed. The initial etching of the printed circuit board is carried out in a commercially available acidic solution provided with oxidants, so that all accessible copper areas are provided with a uniform finely textured surface.

After the treatment, the surface should be free from oxidic regions, from finger prints and from other contaminations and should exhibit a uniform bright color.

The process step of cleaning and surface pre-treatment of the non-conductive areas of the printed circuit board (bore hole walls) which, in addition to its cleaning effect, also causes the non-conductive areas of the printed circuit board to become activated and conditioned, is carried out by means of an organic solvent, preferably a nitrogen-containing solvent, or with an aqueous alkaline solution of the respective solvents, which optionally contain wetting agents. This process step does not only provide the activating and conditioning effects, but in the case of multi-layer circuits also causes any contaminants, if present, of the copper inlays on the bore hole walls to be prepared for the subsequent removal of the contaminants. The duration of treatment should generally be between 0.2 and 20 minutes and be carried out at temperatures of from 20° C. to 80° C. The preceding steps provide an optimum pre-treatment of the printed circuit boards for the subsequent process.

In order to prepare the printed circuit boards for a galvanic or chemical metallization, said printed circuit boards must be subjected to an oxidative pre-treatment, b). The oxidative pre-treatment may be carried out in a pH range of from <1 to 14 and at a temperature of from 20° C. to 95° C. The addition of ionic or non-ionic surfactants in an amount of from 0.1 to 10 g/l improves the quality of the oxidative pre-treatment, is, however, not essential. The oxidative agents are present in a concentration ranging from 0.1 g/l to their solubility limits. The duration of pre-treatment may be between 0.2 and 20 minutes. As the oxidants there may be used, for example, cerium(IV) sulfate, alkali metal manganates, alkali metal permanganates and alkali metal periodates. Potassium permanganate is preferred to be used.

As the oxidative medium for pre-treating the articles to be metallized under alkaline conditions there is prepared an aqueous solution containing 50 g/l of potassium permanganate and 50 g/l of sodium hydroxide. It is advantageous to add about 0.1 g/l of a non-ionic fluoro-surfactant to the solution. The printed circuit boards are preferably left in the tempered solution with slight motion for up to 10 minutes. After the pre-treatment the printed circuit boards are rinsed with water.

As the oxidative medium for pre-treating the articles to be metallized under neutral conditions there is prepared an aqueous solution containing 12 g/l of potassium permanganate and 0.1 g/l of a non-ionic fluoro-surfactant, pH-regulating substances (sodium hydroxide, sulfuric acid etc.) being used for adjusting the pH of the solution to about 7. The printed circuit boards to be treated are preferably left in the solution tempered at about 65° C. with slight motion for 5 minutes. After the oxidative pre-treatment the printed circuit boards are rinsed with water.

As the oxidizing medium for pre-treating the articles to be metallized under acidic conditions there is prepared an aqueous solution containing 10 g/l of potassium permanganate, 0.1 g/l of a non-ionic wetting agent and sulfuric acid so that the solution has a pH value of about 2. The printed circuit boards to be treated are preferably left in the solution with slight motion for about 1 minute. The termperature of the solution is preferably 20° C. to 30° C. After the oxidative pre-treatment the printed circuit boards are rinsed with water.

As the oxidizing medium, there is prepared an aqueous solution of 50 g/l of cerium(IV) sulfate, a non-ionic surfactant and sulfuric acid is prepared so that the pH value of the solution is <1. The printed circuit boards to be treated are preferably left in the solution tempered at 20° C. to 30° C. with slight waving motions for about 5 minutes. After the oxidative pre-treatment the printed circuit boards are rinsed with water.

As a further oxidizing medium, there is prepared an aqueous solution of 50 g/l of sodium periodate, a non-ionic surfactant and sulfuric acid is prepared so that the pH value of the solution is <1. The printed circuit boards to be treated are preferably left in the tempered solution with slight waving motions for 5 minutes. After the oxidative pre-treatment the printed circuit boards are rinsed with water.

For the catalysis process step c) there is employed a solution consisting of a heterocyclic compound, more specifically pyrrole, thiophene or furane, a water-miscible organic solvent such as methanol, ethanol, n-propanol, isopropanol, higher alcohols, polyalcohols, DMF (dimethyl formamide), ketones, cumene sulfonate, N-methyl pyrrolidone, Triglyme, Diglyme, alkali metal salt of the toluene sulfonates or the ethyl esters, and aqueous alkaline solutions or mixtures thereof as solubility promoters/solubilizers for the heterocyclic compound and water. The substrates (printed circuit boards) to be metallized are placed in this solution. Due to the high reactivity of the articles that have been oxidatively pre-treated, such as printed circuit boards, the concentration of the heterocyclic(s)—containing catalysis solution may be within a wide range so that solutions containing from 0.1 to 50% of heterocyclics may be employed. However, it has been found that the optimum of catalyzing properties is exhibited by solutions containing from 5 to 35% of heterocyclic(s). The residence time of the articles such as printed circuit boards in the catalyst solution may range from a few seconds to 20 minutes. The optimum range of residence times has been found to be between 0.2 and 5 minutes. During the treatment of the substrates such as printed circuit boards in the catalyst solutions, the substrates may be subjected to slight motion.

After the catalysis, the articles to be metallized, such as printed circuit boards, are subjected to an activation, d), as a preparation for the following metal deposition. The activation may be effected with oxidizing substances such as, for example, alkali metal persulfates, alkali metal peroxodisulfates, hydrogen peroxide, iron-(III) salts such as ferric chloride, ferric sulfate, potassium hexacyanoferrate(III), alkali metal periodates or similar compounds in an acidic medium. There is also the possibility to allow the activation to take place alone in an acidic medium, for which hydrochloric acid, sulfuric acid, phosphoric acid etc. may be used as acids. The activation may also be effected in an acidic medium with permanent air purging.

For the activation in an acidic oxidizing medium of the articles to be metallized, the catalyzed substrate is kept in an aqueous solution containing 50 g/l of sodium peroxodisulfate and 10 ml/l of sulfuric acid with slight waving motions for from 0.2 to 5 minutes. A film of dark brown or black color is formed on the surface of the printed circuit board and on the bore hole walls. After the activation, the activated substrate is rinsed with running water.

Furthermore, the activation may be effected in an aqueous solution comprising 50 g/l of iron(III) sulfate and 30 ml/l of sulfuric acid. A catalyzed substrate is preferably kept in this solution with slight waving motions within the periods of time mentioned above. A dark-colored coating is formed on the entire surface. After the activation, the activated substrate is rinsed with water.

The activation of the articles to be metallized is effected in an acidic medium consisting of 20% aqueous solution of sulfuric acid with slight waving motions and under permanent air purging within about 0.2 to 5 minutes. After the activation, the activated substrate is rinsed with running water.

If a 5% aqueous hydrochloric acid solution is employed for activation, the substrate accordingly pre-treated is left in the solution with slight waving motions preferably for 0.2 to 10 minutes. Also after the activation with 5% hydrochloric acid, the activated substrate is rinsed with water.

If an 8% aqueous phosphoric acid solution is used, the substrate to be activated is left in said solution with slight waving motions and under permanent air purging for 0.2 to 10 minutes. After the activation, the activated substrate is rinsed with water.

The activation may also be carried out by keeping a substrate which has been pre-treated according to the invention is kept in an aqueous solution containing 60 g/l of sodium peroxodisulfate and 40 ml/l of $H_2SO_4$ with slight waving motions and under permanent air purging for 0.2 to 10 minutes. Also after this kind of activation, the activated substrate is rinsed with water.

In a further preferred embodiment a catalyzed substrate is exposed to the action of an aqueous solution containing 100 ml/l of sulfuric acid and 25 ml/l of aqueous hydrogen peroxide solution (30%) with slight waving motions under permanent air purging for about 3 minutes. Also here after the activation, the activated substrate is rinsed with water.

The amounts of grams and milliliters mentioned above are relative to a total of 1 liter of aqueous solution.

Immediately after the activation, the articles such as printed circuit boards treated according to the above-described process may be subjected to an electroless reductive metal deposition. It is preferred to galvanically deposit the metal immediately after the completion of the activation.

For the electroless metallization there are employed commercially available electrolytes, and preferably copper electrolytes such as, e.g., METALYT® CU NV, under the conventional conditions as known to the artisan.

The electro-deposition of metals is also effected by using known galvanic electrolytes. Basically, all metals or alloys may be deposited which are capable of being used for electro-plated. However, it is preferred to use copper electrolytes. Particularly preferred are copper electrolyte solutions comprising sulfuric acid which have a content of from 50 to 300 g/l of free sulfuric acid and a metal content of from 5 to 50 g/l. However, electrolytes containing fluoroboric acid, hydrochloric acid, thiosulfate or pyrophosphate or cyanidic electrolytes as well as electrolytes based on sulfamines and organic sulfonic acids have proven to be suitable. The electrolytic deposition is effected under the conventional conditions, namely between 20° C. and 70° C. with current densities of between 0.1 to 20 A/dm$^2$. Surprisingly, the period required for the electro-deposition may be significantly shortened, if the galvanic copper deposition is carried out immediately after the activation according to the invention, so that in particularly favourable cases said period will amount to from 2 to 5 minutes. The metal layers obtained are uniform, continuous and, in addition, firmly adhering, which also do not show any defective spots in the so-called through-light test.

The following examples show partial aspects of the invention:

EXAMPLE 1

A substrate material made of a glass fiber-reinforced epoxide resin which has been copper-laminated on both of its surfaces is provided with bore holes and mechanically cleaned in the conventional manner. Then the substrate is treated in an aqueous solution containing 50 g/l of potassium permanganate and 40 g/l of sodium hydroxide at 85° C. for 1 minute, followed by rinsing, drying and slight brushing. Then a commercially available photoresist is applied and exposed to light and developed so that the circuit pattern image and the bores will be exposed for further metallization.

The substrate thus prepared is then immersed in an aqueous catalyst solution containing 20% of pyrrole and 20% of isopropanol at room temperature with slight motion for about 1 minute. In the next treatment step, the printed circuit board is immersed in a solution containing 10 ml/l of sulfuric acid and 10 g/l of sodium peroxodisulfate in water. A conductive polymer film of dark brown to black color forms on the surfaces of the non-conductive areas. The treated board is then rinsed with running water, pickled with 5% aqueous sulfuric acid and electrolytically copper-plated in a commercially available acidic copper bath. The temperature is 23° C., and the current density is 2.3 A/dm$^2$. After about 60 minutes all of the conductor paths and bore holes were completely coated with a firmly adhering copper layer of about 28 μm in thickness.

EXAMPLE 2

A substrate material made of a glass fiber-reinforced epoxide resin which has been copper-laminated on both of its surfaces is provided with bore holes and mechanically cleaned in the conventional manner. Then the substrate is provided with a commercially available photoresist followed by direct exposure to light. After development, the conductor paths and bore holes to be metallized will be exposed for further metallization.

The substrate is then initially etched in an aqueous solution of hydrogen peroxide and sulfuric acid at about 30° C. for 3 minutes, rinsed and introduced into the oxidative pre-treatment stage. The aqueous solution contains 12 g/l of potassium permanganate and 20 ml/l of concentrated sulfuric acid. The substrate board is left with slight motion at room temperature for 2 minutes. Then it is rinsed and immersed in an aqueous solution of 10 g/l of citric acid. In the subsequent step, an aqueous catalyst solution containing 10% of pyrrole, 28% of diethyleneglycol and 0.1 ml/l of a fluoro-surfactant (room temperature/1 minute). Then, without rinsing, substrate board is immersed in a solution containing 50% of sulfuric acid for 1 minute with air purging. The conductive polymer film is formed in the bore holes. The treated board is then rinsed with running water and pickled with 5% sulfuric acid. The metallization is effected in a commercially available acidic copper bath at 23° C. and with a current density of 1.8 A/dm$^2$. After about 20 minutes the circuit pattern image and bore holes were completely coated with a firmly adhering copper layer of about 25 μm in thickness.

EXAMPLE 3

Example 2 was repeated, however with the exceptions that the citric acid treatment was omitted and the catalyst solution comprised 4% of pyrrole and 1% of thiophene.

EXAMPLE 4

Example 2 was repeated, however with the exception that the permanganate oxidation step was replaced by a treatment in an aqueous solution containing 50 g/l of cerium(IV) sulfate and sulfuric acid at pH 1 and 25° C. for 4 minutes.

We claim:

1. A process lot manufacturing through-hole plated printed circuit boards, said process comprising the steps of:
   drilling through-holes in the substrate;
   laminating the surfaces of the substrate with a photoresist;
   exposing the substrate to light and developing the photoresist to expose a circuit pattern image;
   pre-treating the surfaces or the substrate with an oxidizing solution;
   rinsing the substrate to remove any residual oxidizing solution;
   catalyzing the substrate in a solution containing at least one heterocyclic monomer which is electrically conductive in a polymeric form, said at least one heterocyclic monomer being selected from the group consisting of pyrrole, thiophene, furane and derivatives thereof;
   activating the substrate in an acidic solution whereby an electrically conductive polymeric layer is formed; and
   metallizing the through-holes and the circuit pattern image.

2. A process as in claim 1, further comprising the step of mechanical surface cleaning of the surfaces of the substrate prior to drilling of the through-holes.

3. A process as in claim 1, further comprising the step of rinsing any residual acid solution prior to metallizing the through-holes and the circuit pattern image.

4. A process as in claim 1, wherein the through-holes and circuit pattern image are metallized using galvanic metallization.

5. A process as in claim 1, wherein the through-holes and circuit pattern image are metallized using electroless metallization.

6. A process as in claim 1, further comprising the step of subjecting the substrate to a process of initial etching and to a surface preparation of non-conducting areas of conductor plates prior to the step of pre-treating.

7. A process as in claim 1, wherein the drilling and pre-treating steps are reversed, and further comprising rinsing and drying and mechanically cleaning the surfaces of the substrate prior to drilling the through-holes.

8. A process as in claim 6, wherein said process of initial etching includes etching with an acidic oxidizing solution.

9. A process as in claim 6, wherein said surface preparation includes introducing the substrate into a bath including organic solvents or aqueous alkaline solutions of organic solvents.

10. A process as in claim 9, wherein the bath further includes a wetting agent.

11. A process as in claim 9, wherein the organic solvents contain nitrogen.

12. A process as in claim 1, wherein the step of metallizing includes forming a metal layer selected from the group consisting of copper, nickel, gold, palladium, tin, lead and tin/lead alloy.

13. A process as in claim 1, wherein the oxidizing solution used in pre-treating the substrate contains at least one of the group consisting of oxidizing permanganate, manganate, periodate salts and cerium(IV) sulfate.

14. A process as in claim 1, wherein the oxidizing solution used in pre-treating the substrate has a pH value of between less than one and 14.

15. A process as in claim 1, wherein the oxidizing solution used in pre-treating contains a surfactant.

16. A process as in claim 1, wherein the solution containing at least one heterocyclic monomer further includes a solubilizer or solvent or mixtures thereof.

17. A process as in claim 16, wherein the solution containing at least one heterocyclic monomer contains from 1 to 50% of said at least one heterocyclic monomer and contains from 99 to 50% of said solvent or solubilizer or mixtures thereof.

18. A process as in claim 16, wherein said solubilizer or solvents are selected from the group consisting of water, methanol, ethanol, n-propanol, isopropanol, higher alcohols, polyalcohols, dimethyl formamide, ketones, cumene sulfonate, N-methyl pyrrolidone, Triglyme, Diglyme, alkali metal salt of toluene sulfonates or their ethyl esters, and aqueous alkaline solutions or mixtures thereof.

19. A through-hole plated printed circuit board comprising:
a substrate having through-holes formed therein, said through holes having a metal layer thereon;
a layer of electroconductive synthetic polymer formed between the metal layer and the substrate.

20. A printed circuit board as in claim 19, wherein said layer of electroconductive synthetic polymer is formed of polymerized pyrrole or pyrrole derivatives.

21. A printed circuit board as in claim 19, wherein said layer of electroconductive synthetic polymer is from 0.1 to 10 μm in thickness.

22. A bored plated printed circuit board comprising:
a substrate having bores formed therein; and
a layer of electroconductive synthetic polymer formed on said substrate in an area contiguous to the bore holes.

* * * * *